United States Patent
Bacha

(10) Patent No.: US 7,869,243 B2
(45) Date of Patent: Jan. 11, 2011

(54) MEMORY MODULE

(75) Inventor: Abdallah Bacha, Munich (DE)

(73) Assignee: Qimonda AG, Munich (DE)

( * ) Notice: Subject to any disclaimer, the term of this patent is extended or adjusted under 35 U.S.C. 154(b) by 119 days.

(21) Appl. No.: 12/180,054

(22) Filed: Jul. 25, 2008

(65) Prior Publication Data

US 2009/0027940 A1 Jan. 29, 2009

(30) Foreign Application Priority Data

Jul. 27, 2007 (DE) .................. 10 2007 035 180

(51) Int. Cl.
*G11C 5/06* (2006.01)
*H05K 7/00* (2006.01)
*H05K 1/18* (2006.01)
*H05K 1/16* (2006.01)

(52) U.S. Cl. .................. 365/63; 361/760; 361/761; 361/766

(58) Field of Classification Search .......... 365/63; 361/760, 761, 766

See application file for complete search history.

(56) References Cited

U.S. PATENT DOCUMENTS

| 2007/0127304 | A1* | 6/2007 | Yoon et al. | 365/230.01 |
| 2007/0250756 | A1* | 10/2007 | Gower et al. | 714/763 |
| 2007/0258278 | A1 | 11/2007 | Bacha et al. | |
| 2008/0030966 | A1* | 2/2008 | Goodwin | 361/749 |
| 2008/0123305 | A1* | 5/2008 | Amidi et al. | 361/737 |
| 2009/0019195 | A1* | 1/2009 | Djordjevic | 710/53 |

FOREIGN PATENT DOCUMENTS

DE 10 2007 021 307 A1 11/2007

* cited by examiner

*Primary Examiner*—Ly D Pham
(74) *Attorney, Agent, or Firm*—John S. Economou

(57) ABSTRACT

A memory module with a module board is disclosed, on the front side of which a plurality of first memory devices are arranged in rows. A plurality of second memory devices are arranged in rows on the back side. The first and second memory devices have a single chip each. Further, a first register device for providing first control signals to first rows of first memory devices and to first rows of second memory devices is provided. A second register device serves to provide first control signals to second rows of first memory devices and to second rows of second memory devices.

20 Claims, 5 Drawing Sheets

MEMORY MODULE

This application claims priority to German Patent Application 10 2007 035 180.3, which was filed Jul. 27, 2007 and is incorporated herein by reference.

TECHNICAL FIELD

The invention relates to a memory module, particularly for insertion into data processing systems. Particular memory modules for the working memory of computers are referred to as DIM memories (dual inline memory module). The same are offered in different geometrical dimensions and with different memory capacities in the mega or even gigabyte range, and plugged into a respective motherboard of a computer system via a contact strip.

However, there is still a need to provide memory modules where an access to the single memory devices of the module is as low as possible in order to increase the overall speed of the system.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
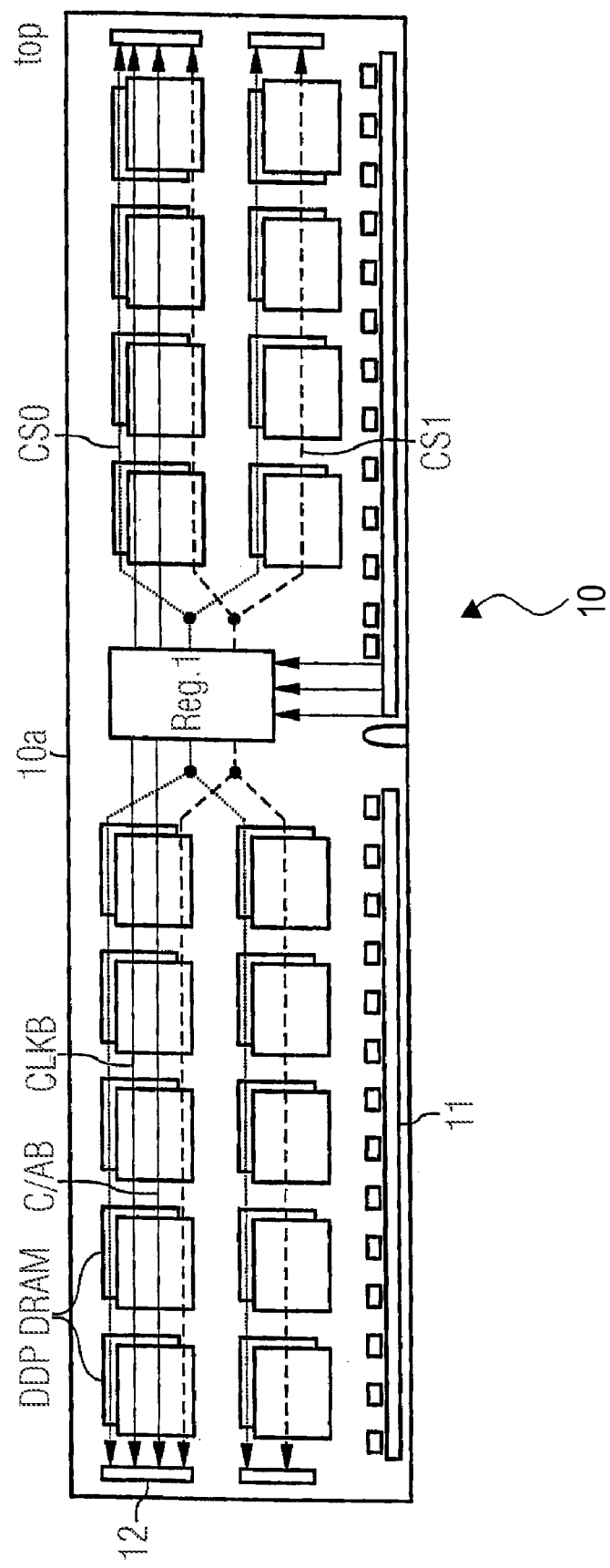
FIG. 1 is a front side of a memory module with stacked DRAM devices.

FIG. 1 shows an exemplary embodiment of a so-called DDR3 memory module (DDR=double data rate) with a plurality of memory devices as well as a register device Reg1 controlling the memory devices. The memory devices DDP-DRAM are implemented as so-called "Dual Die Packages". The same comprise two memory chips stacked on each other, surrounded by a shell, whose terminal contacts are connected to the respective pins of the DDP-DRAM memory device. By stacking two single memories on each other, a memory device with double memory capacity is realized with constant packing height. The single memory devices are deposited on the front side of a memory board 10a and connected to different lines within the memory board 10a with their single terminals. Among these lines are different control lines as well as address lines that are combined as C/AB line in the present embodiment. The single memory devices are also connected to a common clock line CLKB.

The memory module 10 also comprises contact tabs 11 with several contacts for the single terminals to the common control lines, address, clock as well as supply lines. Also, the data terminals for the single memory devices on the memory module are connected to the corresponding data contacts on the contact tabs. Further, the memory module includes a first register unit Reg1, which is connected to the contacts for the control lines C/AB as well as CLKB and CS0, CS1 on the input side. The register unit provides the drive power to control the upper row of memory devices DDP-DRAM. Therefore, the register means passes the signals on the control line C/AB as well as CLKB on to both the left and right memory devices via so-called fly-by wiring. Additionally, the register means Reg1 serves for providing a so-called "chip select signal" (CS) to respectively one of the single memories of each memory device DDP-DRAM.

As illustrated, the register means Reg1 on the front side of the memory module 10 supplies the chip select signal CS0 for the first rank to the respective lower single memories of each memory device. Correspondingly, the second control signal CS1 controls the respective upper single memory of each memory device DDP-DRAM.

Figure 2:
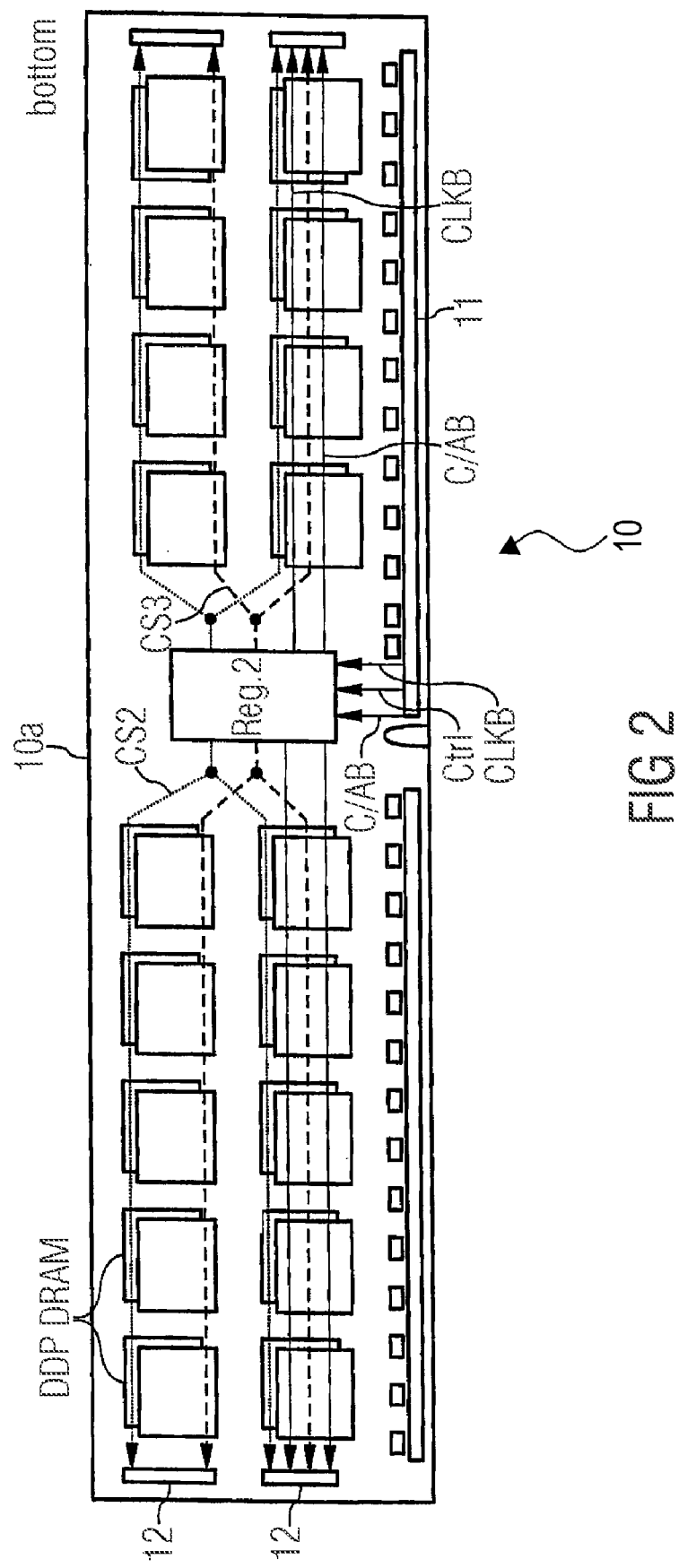
FIG. 2 is the back side of the memory module according to FIG. 1, also with stacked DRAM memory devices.

FIG. 2 shows the back side of the memory module according to FIG. 1. Apart from the memory device in stacked design, a second register means Reg2 is provided on the same. It is also connected to respective contacts of the contact tab on the input side, for supplying the clock signal CLKB, as well as to the control line CTRL and C/AB. However, the second register means Reg2 on the back side supplies the respective clock as well as common and address signals CLKB, C/AB to the lower row on the back and front side of the memory devices DDP-DRAM. Accordingly, the first register means Reg1 on the front side controls the respective upper memory devices on both sides of the memory module 10, and the register means Reg2 on the back side of the memory module controls the respective lower memory devices on both sides of the module 10. For the selection signal CS2 and CS3, the second register means Reg2 as well as the first register means Reg1 use a Y topology. The same refers to a wiring similar to the letter "Y", wherein its base is coupled to the register and the branches to the single memory devices. The second register means Reg2 controls the respective lower single memories of the stacked memory devices DDP-DRAM with the third chip select signal CS2. Correspondingly, the signal CS3 controls the respective upper single memory of the single memory devices of both rows.

The usage of stacked memory devices with two single memories causes an increased load on the control lines C/AB and CLKB. Thereby, the register means Reg1 and Reg2 have to be realized with a higher drive power. Correspondingly, the signal processing speed can also be reduced.

A memory module is suggested, which can obtain a reduction of the load on the single control lines. Therefore, the memory module comprises a module board with a front side as well as a back side. First memory devices are arranged in rows on the front side and second memory devices are arranged in rows on the back side. The first and second memory devices comprise one single chip each. Further, a first register device for providing first control signals to first rows of the first memory devices and to first rows of the second memory devices is provided. A second register device serves for providing the first control signals to second rows of the first memory devices and second rows of the second memory devices.

By using single chips, so-called single die DRAM memory devices, the load on the respective control lines for the first control signals is reduced. Thereby, the memory module can, all in all, obtain a higher processing speed.

In one embodiment, several first control lines for transmitting the first control signals are provided. The same include a first control line branch as well as a second control line branch each, and one node connected to the respective register device. With this embodiment of the control lines, a so-called "Y" topology is implemented. Here, the base of the "Y" is connected to the register device. The respective "branches" form the control line branch and are connected to the first rows of the first and second memory devices or the second rows of the first and second memory devices, respectively. For avoiding reflections, it is effective to provide the first and second control line branches with a terminating resistor each on the end side.

Further, the first register device for providing second control signals to a respective first row of the first and second rows can be implemented on the front side and the back side. Correspondingly, the second register device for providing second control signals to a respective second row of the first and second rows can be implemented on the front side and the back side of the memory module. Thereby, one row of the first and second rows of memory devices on the front and back side is controlled by different registers with regard to the first and second control signals. For this, the second control signals can comprise the selection signal for selecting the chips in the respective row.

Additionally, the control lines provided for transmitting the second control signals can also be implemented in the Y topology. In this case also, the base of the "Y" is coupled to the respective register devices, and the branches of the "Y" to the respective contact points of the single memory devices.

The single control lines can be arranged in different levels within the board of the memory module. For reducing the space requirements, it is also possible to mount two adjacently arranged memory devices of the plurality of first and second devices rotationally displaced to each other on the memory module.

Figure 3:
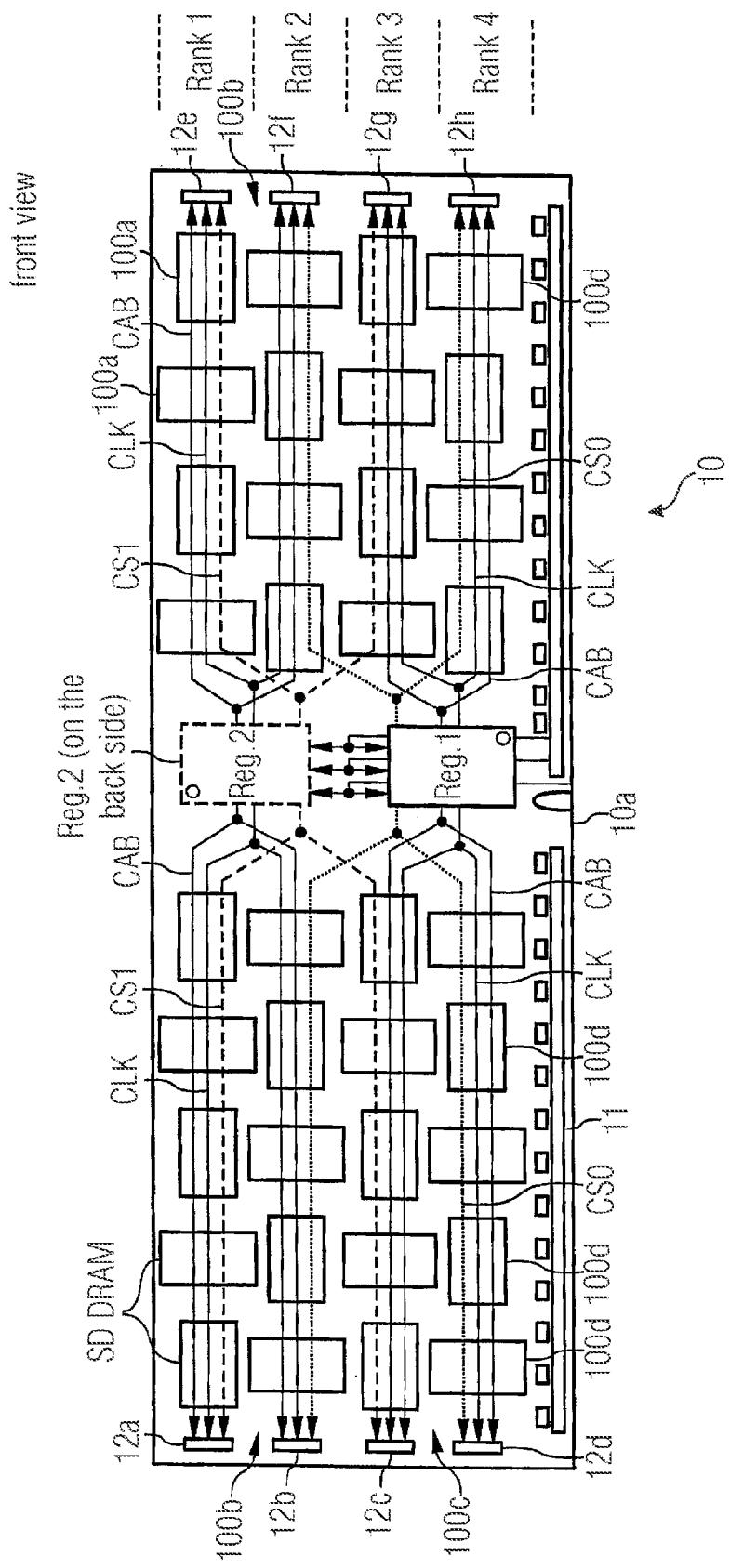
FIG. 3 is the front side of an embodiment with single memory devices.

FIG. 3 shows the top view of an embodiment of a memory module 10 according to the suggested principle. A plurality of single memory devices is arranged on the front side of the memory module in four rows, the so-called "ranks". These memory devices are referred to as SD-DRAM memory devices for "single die" devices. The arrangement in rows is made such that two adjacent memory devices are each connected to the memory module 10 in a rotationally symmetrical manner displaced by 90 degrees. By the displacement of adjacent memory devices, the space needed is reduced all in all.

Each of the memory devices 100a of the first row up to the memory devices 100d of the fourth row comprises a plurality of pins, which are connected to different control, supply and address lines on the board 10a of the module 10. The control lines are each connected to respective terminating resistors 12a to 12h at their end area. Signal reflections on the control lines are reduced by the terminating resistors 12a to 12h, and thus the signal quality is improved.

A first register device Reg1 is arranged substantially in the middle of the memory module 10 in the lower portion. A second register device Reg2 in the upper portion, which is illustrated in a dotted way, is deposited on the respective position on the back side of the memory module 10. The same will be discussed later. Further, the register device Reg1 includes a plurality of signal inputs connected to respective contacts on the contact tab for the control signals CAB, the clock signal CLK and, if needed, supply signals or chip select signals CS. Each of the signals can be supplied in a single line running within the board of the memory module 10.

The register means Reg1 serves to provide the drive power for controlling and for signal transmission to the single memory devices on the memory module 10. For that purpose, different control lines for the signals CB and CLK are provided in the so-called Y topology. For this, the base of this "Y" is connected to the respective register means Reg1. The branches of the "Y" run along the memory module 10 to the respective terminating resistors 12C, 12G as well as 12H and 12D in the end area of the memory module. The single memory devices are connected in parallel to the control lines.

In particular, the register means includes respective first control lines with a first and a second power branch on the respective right and left side for the common control and address signals CAB. Thereby, the first control line branch provides the corresponding control and address signals CAB for the memory devices of the third row Rank3, and the second control line branch provides the control and address signals CAB for the memory devices of the fourth row Rank4. In the same way, the control lines for the clock signal CLK on the right and left side are connected to the first register means Reg1 via a Y topology. Thus, the register means Reg1 provides the common and address control signals as well as the clock signal CLK for the third and fourth row of memory devices. This applies both for the rows on the front side as well as on the back side of the board of the memory module 10.

Further, the first register means Reg1 includes driver circuits for providing a selection signal CS for the single memory devices. This is also referred to as "chip select signal." In contrary to the "common and address signals" CAB as well as the clock signal CLK, control lines are provided, whose first control line branches are connected to the memory devices 100b of the second row and whose second control line branches are connected to the devices 100d of the fourth row on the front side. The respective memory devices on the back side of the board 10a of the module 10 are controlled as well. Thus, the register means Reg1 controls the memory devices of the second and fourth rows via the "chip select signal CS0" and selects the same for a memory or read access, respectively.

Correspondingly, the second register means Reg2 on the back side of the memory module 10 provides the "common and address signals" CAB as well as the clock signal CLK for the memory devices of the two first rows Rank1 and Rank2. Therefore, the register means Reg2 is also connected in Y topology to the first and second control line branches on the front and back side for correspondingly controlling the memory devices. A selection signal CS1 is supplied to the memory devices of the first row Rank1 as well as to the third row Rank3 on the front side of the memory module 10 by the register means Reg2. The selection signal CS3 serves as selection signal for the rows Rank1 and Rank3 on the back side. Thus, all in all, the register means Reg1 selects the memory devices of the second and fourth rows and the register means Reg2 the memory devices of the first and third rows on the front side of the memory module.

Figure 4:
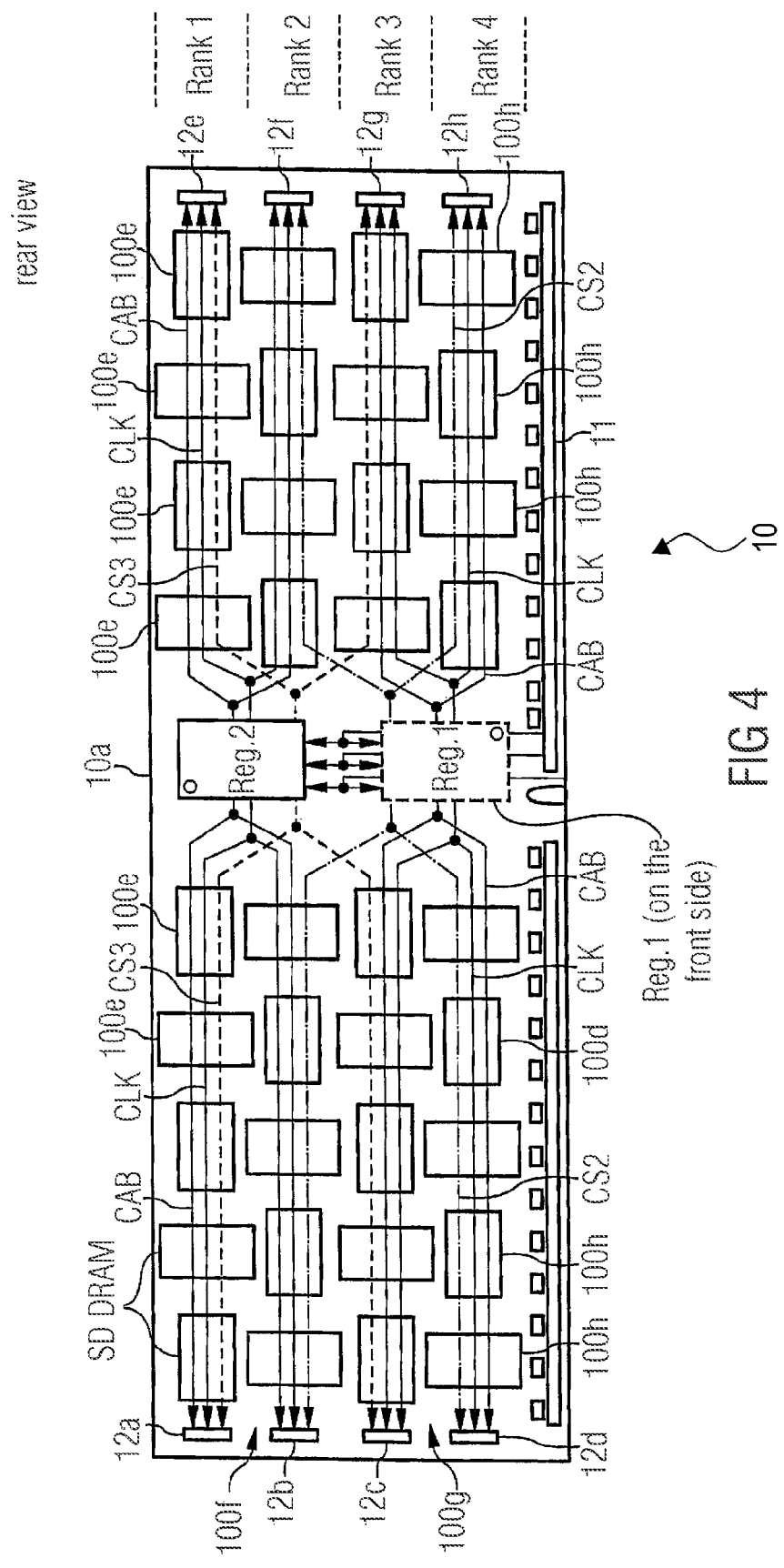
FIG. 4 is the back side of the embodiment with single memory devices.

FIG. 4 shows the rear view of the memory module according to the arrangement of FIG. 3. The second register device Reg2 is mounted on the back side of the memory module 10. The same drives the corresponding memory devices of the first and second rows, also on the back side, with its control lines for the common and address signals CAB as well as the clock signals CLK. Further, it provides a selection signal CS3 for the first and third rows of memory devices on the back side. Corresponding control line branches for the memory devices of the second and fourth rows Rank2, Rank4 are connected in the "Y" topology to the register means Reg1 on the front side of the memory module.

With the illustrated four rows of single memories, the load on the control lines for the common and address signals as well as the clock signals is reduced. Thereby, the memory module can be operated with a higher processing speed. In the illustrated embodiment, the first register drives the control lines for the common and address signals as well as the clock signal of the third and fourth row of devices, the second register is used for the operation of the respective first and second row of devices.

Figure 5:
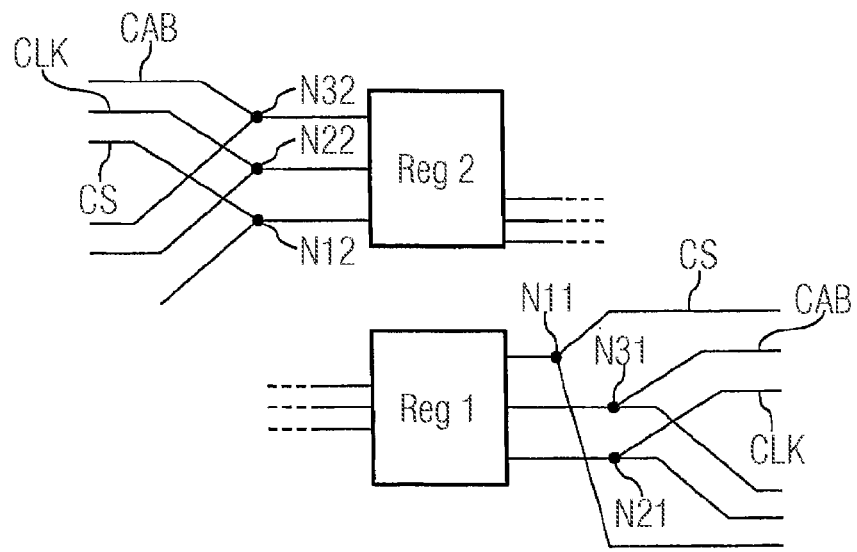
FIG. 5 is a section of a further embodiment with register devices on a side of a memory module.

FIG. 5 shows a modification of the memory module, where the registers Reg1 and referred to as bus lines, are again each implemented in a Y-topology. The single registers are each coupled to a node N11 to N32. The node divides the base in two single control lines, in which the control line signals CAB, the clock signal CLK and the selection signals CS0 to CS3 Reg2 are arranged on the same side of the memory module. The single control lines, also are supplied.

Figure 6:
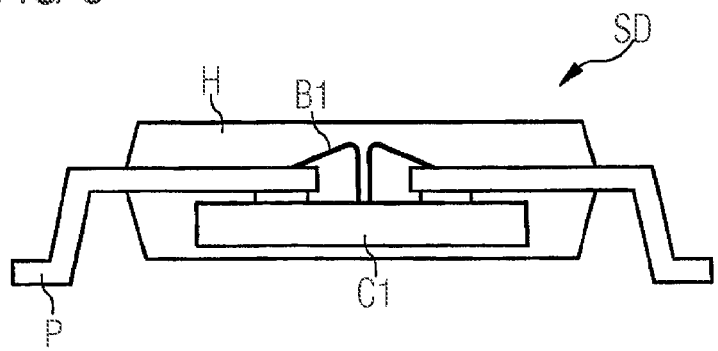
FIG. 6 is a cross-sectional schematic illustration for illustrating a single memory device.

FIG. 6 shows an embodiment of a single memory, as it is, for example, deposited on the memory module. The memory device SD as "single die package" comprises a shell H, mostly of plastic, which is arranged around the semiconductor body C1 including the actual memory. The semiconductor body has a plurality of contact pads on its surface, which are connected to metal lines, either directly or via bonding wires B1. These metal lines are lead out of the shell H and implemented as pins.

Figure 7:
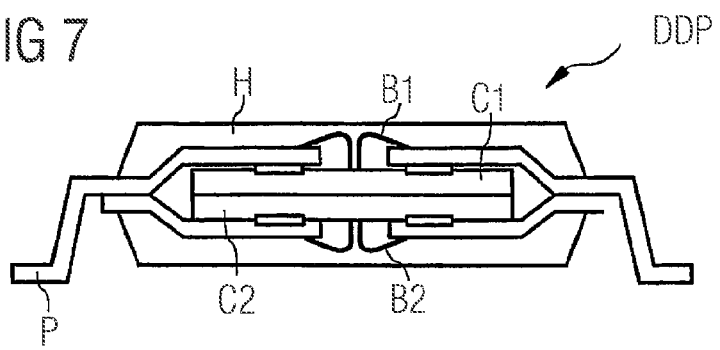
FIG. 7 is a cross-sectional schematic drawing with two stacked memory chips.

In the embodiment of a stacked memory shown in FIG. 7, two single memories C1 and C2 are arranged directly on top of each other. The same are also surrounded by a plastic shell H, the package. The corresponding contact pads are again connected to the respective pins via bonding wires and direct contacting with the metal lines, respectively.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A memory module, comprising:
   a module board comprising a front side and a back side;
   a plurality of first memory devices arranged in at least two rows on the front side;
   a plurality of second memory devices arranged in at least two rows on the back side;
   a first register device for providing first control signals to at least one first row of the first memory devices and to at least one first row of the second memory devices;
   a second register device for providing first control signals to at least one second row of the first memory devices and to at least one second row of the second memory devices; and
   contact terminals for coupling the memory module to a data processing system, the contact terminals comprising control line terminals and common data line terminals wherein a first subset of the control line terminals are connected to the first register device, a second subset of the control line terminals are connected to the second register device, and the common data line terminals are connected to the plurality of first memory devices and to the plurality of second memory devices.

2. The memory module according to claim 1, wherein the first and second memory devices each comprise a single chip.

3. The memory module according to claim 1, further comprising a plurality of first control lines for transmitting the first control signals, each first control line comprising a first control line branch and a second control line branch and each first control line comprising a node connected to the respective register device.

4. The memory module according to claim 1, wherein the first control signals at least comprise:
   an addressing signal;
   a clock signal; and
   common control signals.

5. The memory module according to claim 1, wherein the first and second register devices are arranged on the module board.

6. The memory module according to claim 1, wherein the first register device is arranged on the front side of the module board and the second register device is arranged on the back side of the module board.

7. The memory module according to claim 1, wherein two adjacently arranged memory devices of the plurality of first and second memory devices are arranged rotationally offset from each other.

8. The memory module according to claim 1, wherein the first and second memory devices are arranged in two rows each or four rows each.

9. A memory module, comprising:
   a module board comprising a front side and a back side;
   a plurality of first memory devices arranged in at least two rows on the front side;
   a plurality of second memory devices arranged in at least two rows on the back side;
   a first register device for providing first control signals to at least one first row of the first memory devices and to at least one first row of the second memory devices;
   a plurality of first control lines for transmitting the first control signals, each first control line comprising a first control line branch and a second control line branch and each first control line comprising a node connected to the respective register device, wherein the first and second control line branches are provided with a terminating resistor on an end side;
   a second register device for providing first control signals to at least one second row of the first memory devices and to at least one second row of the second memory devices; and
   contact terminals for coupling the memory module to a data processing system, the contact terminals comprising control line terminals and common data line terminals, wherein a first subset of the control line terminals are connected to the first register device, a second subset of the control line terminals are connected to the second register device, and the common data line terminals are connected to the plurality of first memory devices and to the plurality of second memory devices.

10. The memory module according to claim 9, wherein the first register device is implemented for providing second control signals to a respective at least one first row of the first and second rows on the front side and the back side, and the second register device is implemented for providing second control signals to a respective at least one second row of the first and second rows on the front side and the back side.

11. The memory module according to claim 10, wherein the second control signals comprise at least a selection signal for selecting the memory devices of the respective row.

12. The memory module according to claim 9, wherein the first control signals at least comprise:
   an addressing signal;
   a clock signal; and
   common control signals.

13. The memory module according to claim 9, wherein the first register device is arranged on the front side of the module board and the second register device is arranged on the back side of the module board.

14. The memory module according to claim 9, wherein the first and second memory devices are arranged in two rows each or in four rows each.

15. A memory module, comprising:
a module board comprising a front side and a back side;
a plurality of first memory devices arranged in at least two rows on the front side;
a plurality of second memory devices arranged in at least two rows on the back side;
a first register device for providing first control signals to at least one first row of the first memory devices and to at least one first row of the second memory devices; and
a second register device for providing first control signals to at least one second row of the first memory devices and to at least one second row of the second memory devices, wherein the first register device is implemented for providing second control signals to a respective at least one first row of the first and second rows on the front side and the back side, and the second register device is implemented for providing second control signals to a respective at least one second row of the first and second rows on the front side and the back side; and
contact terminals for coupling the memory module to a data processing system, the contact terminals comprising control line terminals and common data line terminals, wherein a first subset of the control line terminals are connected to the first register device, a second subset of the control line terminals are connected to the second register device, and the common data line terminals are connected to the plurality of first memory devices and to the plurality of second memory devices.

16. The memory module according to claim 15, wherein the second control signals comprise at least a selection signal for selecting the memory devices of the respective row.

17. The memory module according to claim 15, wherein several second control lines are provided for transmitting the second control signals, each comprising a first control line branch and a second control line branch, and each comprising a node connected to the respective register device.

18. The memory module according to claim 15, further comprising a plurality of first control lines for transmitting the first control signals, each first control line comprising a first control line branch and a second control line branch and each first control line comprising a node connected to the respective register device.

19. The memory module according to claim 15, wherein the first control signals at least comprise:
an addressing signal;
a clock signal; and
common control signals.

20. The memory module according to claim 15, wherein the first register device is arranged on the front side of the module board and the second register device is arranged on the back side of the module board.

* * * * *